(12) United States Patent
Aoki et al.

(10) Patent No.: US 6,340,888 B1
(45) Date of Patent: Jan. 22, 2002

(54) MAGNETIC FIELD GENERATOR FOR MRI

(75) Inventors: Masaaki Aoki, Takatsuki; Shigeo Hashimoto, Saga, both of (JP)

(73) Assignee: Sumitomo Special Metals Co., Ltd., Osaka (JP)

( * ) Notice: Subject to any disclaimer, the term of this patent is extended or adjusted under 35 U.S.C. 154(b) by 0 days.

(21) Appl. No.: 09/386,146

(22) Filed: Aug. 31, 1999

(30) Foreign Application Priority Data

Sep. 2, 1998 (JP) .......................................... 10-265754
Jul. 28, 1999 (JP) .......................................... 11-213414

(51) Int. Cl.$^7$ ................................................ G01V 3/00
(52) U.S. Cl. ...................................... 324/319; 324/320
(58) Field of Search ............................... 324/319, 320, 324/318, 322, 300; 335/296, 306; 600/422

(56) References Cited

U.S. PATENT DOCUMENTS

| | | | |
|---|---|---|---|
| 4,672,346 A | 6/1987 | Miyamoto et al. | 335/296 |
| 4,679,022 A | 7/1987 | Miyamoto et al. | 335/296 |
| 4,943,774 A | 7/1990 | Breneman et al. | 324/318 |
| 5,431,165 A | 7/1995 | Sellers | 128/653.5 |
| 5,436,607 A | 7/1995 | Chari et al. | 335/216 |
| 5,495,222 A * | 2/1996 | Abele et al. | 335/306 |
| 5,565,834 A * | 10/1996 | Hanley et al. | 335/296 |
| 6,198,286 B1 * | 3/2001 | Trequattrini et al. | 324/319 |

FOREIGN PATENT DOCUMENTS

| | | |
|---|---|---|
| EP | 0 619 499 | 10/1994 |
| JP | 61-222208 | 10/1986 |
| JP | 3-39139 | 2/1991 |
| JP | 3-274710 | 12/1991 |
| JP | 6-176917 | 6/1994 |
| JP | 6-244018 | 9/1994 |
| JP | 6-290934 | 10/1994 |
| JP | 7-171131 | 7/1995 |
| JP | 8-339916 | 12/1996 |

OTHER PUBLICATIONS

Notification of Reasons for Refusal to the corresponding Japanese Patent Application No. 11–213414 (and translation thereof).
Japanese Design Registration No. 847567.
Japanese Design Registration No. 849825, Similtude No. 1.
Patent Abstracts of Japan vol. 1996, No. 06, (Jun. 28, 1996) & JP 08 045729 A (Sumitomo Special Metals Co Ltd), Feb. 16, 1996.
Japanese Design Registration No. 847566, Similtude No. 1. pp. 171–172.
Decision of Refusal to the corresponding Japanese Patent Application No. 11–213414 (and translation thereof) (2 pages).

* cited by examiner

Primary Examiner—Louis Arana
(74) Attorney, Agent, or Firm—Armstrong, Westerman, Hattori, McLeland & Naughton, LLP.

(57) ABSTRACT

A magnetic field generator for MRI comprises a pair of plate yokes opposed to each other with space in between. A magnet is provided in each of the opposed surfaces of the pair of plate yokes. A column yoke is connected to the pair of plate yokes. An enhancing member made of magnetic material and having a curved slant face is provided in an inner surface of the connection between the column yoke and the plate yokes at a place farthest from the magnet. A first bolt of magnetic field adjusting bolts is screwed into the plate yoke, with a tip of the first bolt contacting the enhancing member. A second bolt of the magnetic field adjusting bolts is screwed into the plate yoke, with a tip of the second bolt contacting an upper end face of the column yoke. An engaging portion for engagement of the enhancing member with the yoke may be provided.

7 Claims, 15 Drawing Sheets

F I G. 9
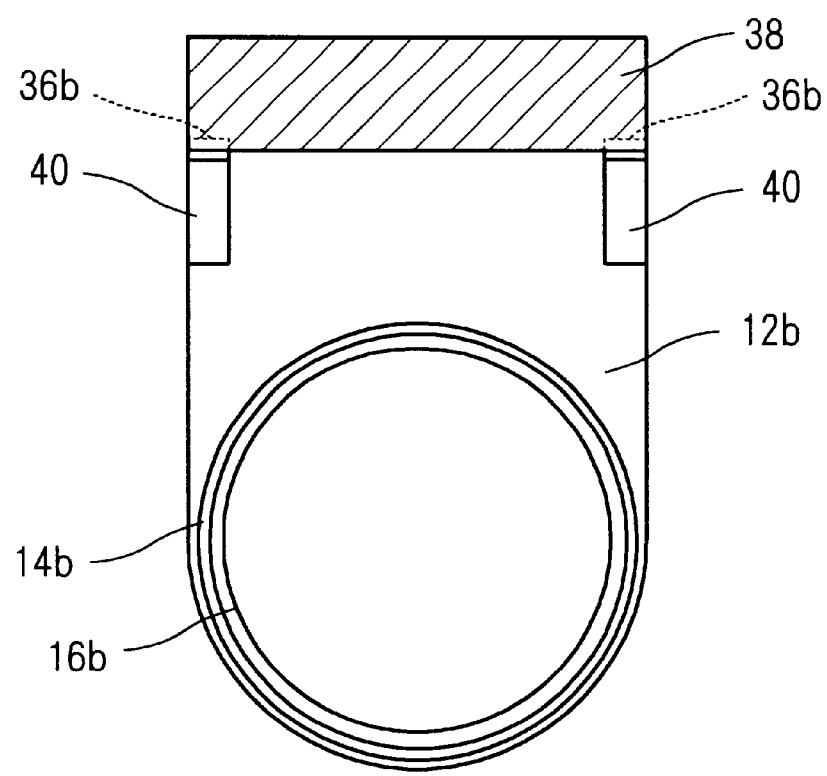

MAGNETIC FIELD GENERATOR FOR MRI

BACKGROUND OF THE INVENTION

1. Field of the Invention

The present invention relates to a magnetic field generator for an MRI, and more specifically to an open type magnetic field generator for MRI.

2. Description of the Related Art

Related art in this kind is disclosed in the Japanese Patent Laid-Open No. 6-176917. An MR open-type magnetic apparatus disclosed in this Laid-Open comprises two magnet blocks each made of a plurality of magnets. The magnet blocks are spaced from each other for providing work space. Each of the magnet blocks includes an annular superconductive coil cluster and a magnetic field enhancer. The two magnet blocks are supported by a generally C-shaped supporting frame made of nonmagnetic material such as stainless steel or aluminum.

However, there is a problem according to the above related art. Specifically, manufacturing is difficult because of the use of specially shaped supporting frame formed into a Roman character C, resulting in increased cost.

Another example of related art is disclosed but not detailed in the Japanese Design Registration No. 847566, Similitude No. 1.

SUMMARY OF THE INVENTION

It is therefore a primary object of the present invention to provide a magnetic field generator for MRI that is easy to manufacture at a lower cost.

A first magnetic field generator for MRI according to the present invention comprises a pair of plate yokes opposed to each other with space in between, a magnet provided in each of the opposed surfaces of the pair of plate yokes, a column yoke connected to the pair of plate yokes for magnetic connection of the pair of plate yokes, and an enhancing member made of magnetic material and provided in an inner surface of the connection between the column yoke and the plate yokes.

According to the first magnetic field generator, manufacturing can be performed easily and at low cost by simply connecting the pair of plate yokes to the column yoke so that the pair of plate yokes is opposed to each other with space in between, and attaching the enhancing member in an inner surface of the connection between the column yoke and the plate yokes. Further, the enhancing member is made of magnetic material, and therefore functions as part of the yoke, practically increasing cross section of the yoke at the connecting portion. This reduces leakage magnetic flux, providing a stronger magnetic field.

According to the first magnetic field generator, preferably the enhancing member has a curved slant face. This makes possible to provide a greater space for accommodating a patient, while improving operability of medical operations performed by a medical doctor. Further, preferably the enhancing member is provided in an inner surface of the connection between the column yoke and the plate yokes at a place farthest from the magnet. By providing the enhancing member at the farthest location from the magnet thereby increasing the distance between the enhancing member and the magnet, it becomes possible to prevent the magnetic flux generated by the magnet from short-circuiting to the enhancing member, eliminating the magnetic flux short circuiting, maintaining a uniform and strong magnetic field.

A second magnetic field generator for MRI according to the present invention comprises a pair of plate yokes opposed to each other with space in between, a magnet provided in each of the opposed surfaces of the pair of plate yokes, a column yoke connected to the pair of plate yokes for magnetic connection of the pair of plate yokes, and an enhancing member having a curved slant face and provided in an inner surface of the connection between the column yoke and the plate yokes.

According to the second magnetic field generator, manufacturing can be performed easily and at low cost by simply connecting the pair of plate yokes to the column yoke so that the pair of plate yokes is opposed to each other with space in between, and attaching the enhancing member in an inner surface of the connection between the column yoke and the plate yokes. Further, by using the enhancing member having a curved slant face, it becomes possible to provide a greater space for accommodating the patient, while improving operability of medical operations performed by the medical doctor.

According to each of the above mentioned generators, preferably the magnetic field generator further comprises a magnetic field adjusting bolt for adjustment of magnetic field by adjustment of relative position between the pair of plate yokes. By adjusting screwing depth of the magnetic field adjusting bolt, relative position between the pair of plate yokes can be adjusted, thereby adjusting the strength and distribution of the magnetic field.

A third magnetic field generator for MRI according to the present invention comprises a pair of plate yokes opposed to each other with space in between, a magnet provided in each of the opposed surfaces of the pair of plate yokes, a column yoke connected to the pair of plate yokes for magnetic connection of the pair of plate yokes, an enhancing member provided in an inner surface of the connection between the column yoke and the plate yokes, and a magnetic field adjusting bolt for adjustment of magnetic field by adjustment of relative position between the pair of plate yokes.

According to the third magnetic field generator, manufacturing can be performed easily and at low cost by simply connecting the pair of plate yokes to the column yoke so that the pair of plate yokes is opposed to each other with space in between, and attaching the enhancing member in an inner surface of the connection between the column yoke and the plate yokes. Further, by adjusting screwing depth of the magnetic field adjusting bolt, relative position between the pair of plate yokes can be adjusted, thereby adjusting the strength and distribution of the magnetic field.

Preferably, the magnetic field adjusting bolt includes a first bolt and a second bolt. The first bolt is screwed into the plate yoke with a tip of the first bolt contacting the enhancing member, and the second bolt is screwed into the plate yoke with a tip of the second bolt contacting an upper end face of the column yoke. Use of the first bolt and the second bolt as the magnetic field adjusting bolt makes possible to translate the plate yoke by adjusting the screwing depth of the first and second bolts.

Further, according to each of the magnetic field generators described above, preferably the magnetic field generator further comprises an engaging portion for engagement of at least one of the plate yoke and the column yoke with the enhancing member. By engaging the yoke with the enhancing member by the engaging portion, it becomes possible to provide better protection to the yoke from being out of alignment, making possible to shorten time required for re-adjusting the magnetic field distribution after the transportation.

A fourth magnetic field generator for MRI according to the present invention comprises a pair of plate yokes opposed to each other with space in between, a magnet provided in each of the opposed surfaces of the pair of plate yokes, a column yoke connected to the pair of plate yokes for magnetic connection of the pair of plate yokes, an enhancing member provided in an inner surface of the connection between the column yoke and the plate yokes, and an engaging portion for engagement of at least one of the plate yoke and the column yoke with the enhancing member.

According to the fourth magnetic field generator, manufacturing can be performed easily and at low cost by simply connecting the pair of plate yokes to the column yoke so that the pair of plate yokes is opposed to each other with space in between, and attaching the enhancing member in an inner surface of the connection between the column yoke and the plate yokes. Further, by engaging the yoke with the enhancing member by the engaging portion, it becomes possible to provide better protection to the yoke from being out of alignment, making possible to shorten time required for re-adjusting the magnetic field distribution after the transportation.

The above described objects and other objects, features, aspects and advantages of the present invention will become more apparent from the following detailed description of embodiments when taken in conjunction with the accompanying drawings.

BRIEF DESCRIPTION OF THE DRAWINGS

FIG. 9 is a lateral sectional view of the embodiment in FIG. 7;

DETAILED DESCRIPTION OF THE PREFERRED EMBODIMENTS

Now, embodiments of the present invention will be described with reference to the accompanying drawings.

Figure 1:
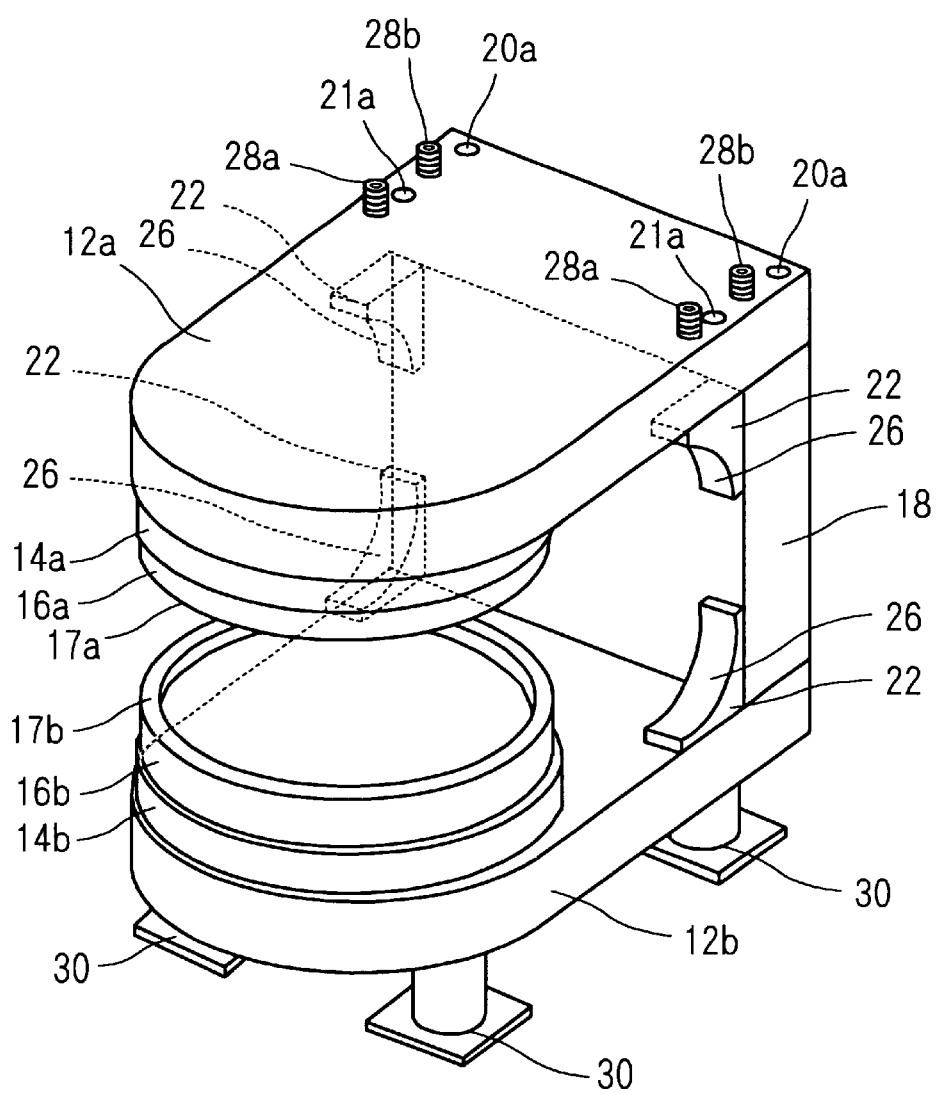
FIG. 1 is a perspective view of an embodiment of the present invention.

FIG. 1 shows a magnetic field generator for MRI 10 as an embodiment of the present invention. The generator 10 is an open type magnetic field generator for MRI, and comprises a pair of plate yokes 12a, 12b opposed to each other with a space in between. Each of the plate yokes 12a, 12b has a surface opposed to that of the other plate yoke, and this surface is provided with a permanent magnet 14a (14b) made of neodynium magnet described the U.S. Pat. No. 4,770,723 for example. Each of the permanent magnets 14a, 14b has a surface opposed to that of the other permanent magnet, and this surface is fixed with a pole piece 16a (16b). It should be noted here that the pole pieces 16a, 16b respectively have annular portions 17a, 17b for uniformalizing a magnetic field generated between the pole pieces 16a, 16b.

The plate yokes 12a, 12b are magnetically connected by a plate-like column yoke 18. Specifically, the column yoke 18 is connected to the plate yokes 12a, 12b so that an upper end face of the column yoke 18 meets an end portion of a lower surface of the plate yoke 12a whereas a lower end face of the column yoke 18 meets an end portion of an upper surface of the plate yoke 12b. Each of the plate yokes 12a, 12b is connected to the column yoke 18 generally at 90-degree angle so as to make a generally C-shaped structure when viewed from a side. As clearly seen from FIG. 2, the plate yoke 12a and the column yoke 18 are fixed to each other by fixing bolts 20 a screwed from an upper surface of the plate yoke 12a. On the other hand, the plate yoke 12b and the column yoke 18 are fixed to each other by fixing bolts 20b screwed from a lower surface of the plate yoke 12b. By supporting the pair of plate yokes 12a, 12b by a single plate-like column yoke 18 as described above, it becomes possible to make the generator 10 compact, make the opening wide, and make the cross section of a space for accommodating a patient sufficiently wide. It should be noted that plate yokes 12a, 12b, pole pieces 16a, 16b, and the column yoke 18 are made of magnetic material such as JIS Rolled Steels for General Structure. Further, each of the fixing bolts 20a, 20b, fixing bolts 21a, 21b, 24a, 24b, and magnetic field adjusting bolts 28a, 28b to be described later is made of steel or stainless steel for example.

Figure 2:
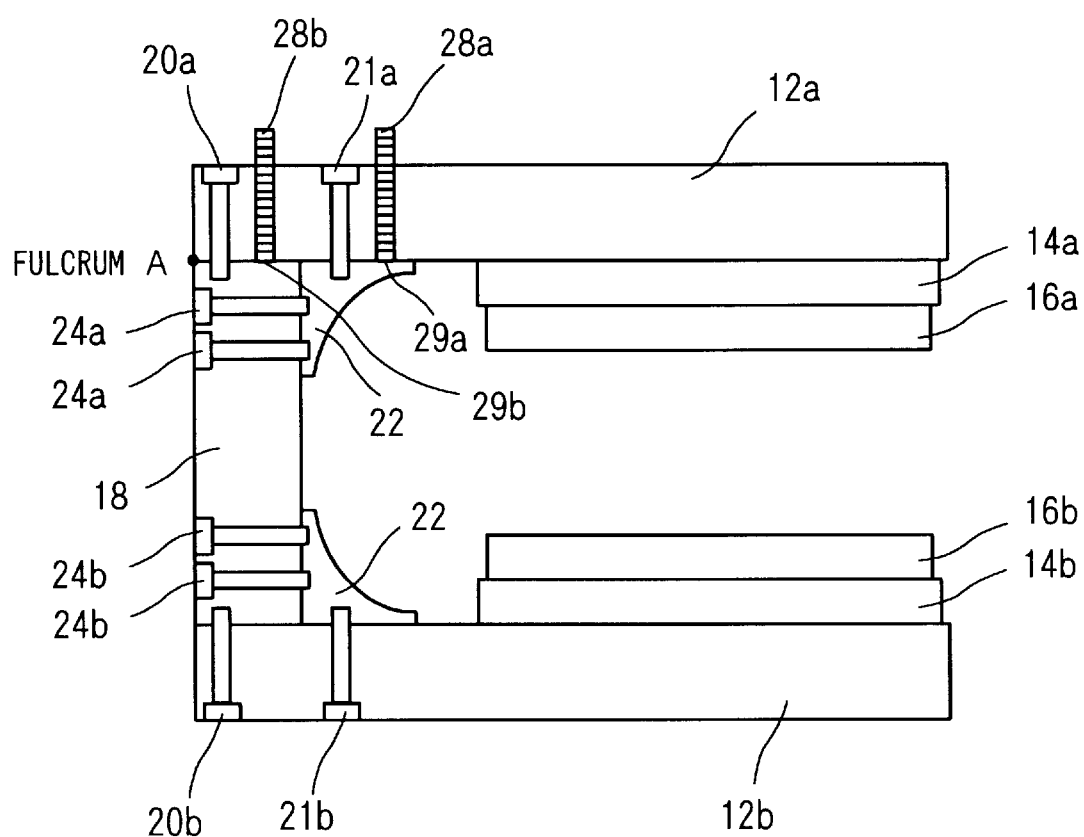
FIG. 2 is an illustration showing a primary portion of the embodiment in FIG. 1.
Figure 3:
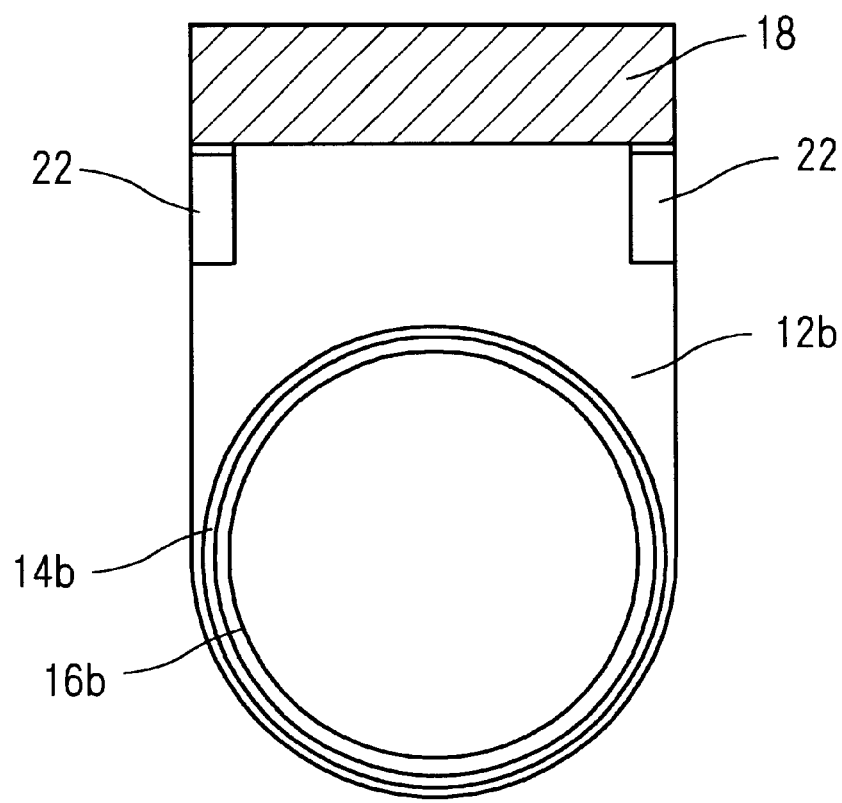
FIG. 3 is a lateral sectional view of the embodiment in FIG. 1.

Further, as shown in FIG. 3 for example, enhancing members 22 are attached respectively to locations farthest from the permanent magnet 14b in an inner surface of the connection between the plate yoke 12b and the column yoke 18. (According to this embodiment, the farthest locations are two ends of the inner surface of the connection between the plate yoke 12b and the column yoke 18.) Each of the enhancing members 22 is fixed to the column yoke 18 by two fixing bolts 24b screwed from an outer surface of the column yoke 18 as shown in FIG. 2. Likewise, another set of enhancing members 22 are attached respectively to locations farthest from the permanent magnet 14a in an inner surface of the connection between the plate yoke 12a and the column yoke 18. (According to this embodiment, the farthest locations are two ends of the inner surface of the connection between the plate yoke 12a and the column yoke 18.) Each of these enhancing members 22 is fixed to the column yoke 18 by two fixing bolts 24a screwed from an outer surface of the column yoke 18 as shown in FIG. 2. Thus, according to this embodiment, a total of four enhancing members 22 are used, providing enhanced fixation between the plate yoke 12a and the column yoke 18, and between the plate yoke 12b and the column yoke 18 respectively. Each of the enhancing members 22 is made of magnetic material such as steel, and is formed to have a curved slant face 26.

Further, as shown in FIG. 2, magnetic field adjusting bolts 28a, 28b are screwed into the plate yoke 12a. Each of the magnetic field adjusting bolts 28a, 28b is made of a hexagon socket head screw. The magnetic field adjusting bolt 28a is screwed into the plate yoke 12a so that a tip 29a contacts the enhancing member 22, whereas the magnetic field adjusting bolt 28b is screwed into the plate yoke 12a so that a tip 29b contacts the upper end surface of the column yoke 18. By controlling screwing depth of the magnetic field adjusting bolts 28a and 28b, location of the plate yoke 12a can be adjusted in relation to a fulcrum A, which makes possible to adjust relative location between the pair of plate yokes 12a, 12b, further making possible to translate vertically the plate yoke 12a.

For example, if the magnetic field adjusting bolt 28a is screwed till its tip 29a contacts the enhancing member 22 and then the screwing operation is continued further, the plate yoke 12a is raised to turn around the fulcrum A (in a counterclockwise direction in FIG. 2). On the other hand, if the magnetic field adjusting bolt 28a is then loosened, the raised plate yoke 12a moves back toward its original position. The same goes with the magnetic field adjusting bolt 28b, which is screwed so that its tip 29b contacts the upper end surface of the column yoke 18.

Further, if both of the magnetic field adjusting bolts 28a and 28b are continued to be screwed in, the plate yoke 12a translate in an upward direction. On the other hand, if the magnetic field adjusting bolts 28a, 28b are then loosened, the plate yoke 12a moves back toward its original position. In such a manner, the plate yoke 12a can be translated in vertical directions.

After performing the adjustment as described above, the plate yoke 12a and the enhancing members 22 are finally fixed together by fixing bolts 21a, whereas the plate yoke 12b and the enhancing members 22 are finally fixed together by fixing bolts 21b.

Further, the lower surface of the plate yoke 12b is attached with four leg members 30.

According to the generator 10 described above, basic assembly is completed by connecting the pair of plate yokes 12a, 12b to the column yoke 18, and then by attaching the enhancing members 22 to respective inner surfaces of the connection between the column yoke 18 and plate yokes 12a, 12b. As a result, it becomes possible to manufacture the generator 10 easily and at low cost. Further, provision of the enhancing members 22 increases mechanical strength. Thus, disturbance of the magnetic field uniformity resulting from a relatively low frequency resonance during transportation can be kept within a small range.

It should be noted here that the generator 10 is very heavy. For example an upper unit (including the plate yoke 12a, the permanent magnet 14a and the pole piece 16a) weighs four tons approximately, a lower unit (including the plate yoke 12b, the permanent magnet 14b and the pole piece 16b) also weighs four tons approximately, and the column yoke 18 weighs 2 tons approximately. Considering the floor strength where the generator 10 is installed, making the generator 10 heavier is not preferable. The use of the enhancing members 22 in the generator 10 is very effective in this regard, because the provision of the enhancing members 22 in the inner surfaces of the connection of plate yokes 12a, 12b and the column yoke 18 makes possible to increase mechanical strength without adding too much weight to the generator 10.

When adjustment is made to the magnetic field during assembly of the generator 10 and after transportation of an MRI apparatus, the distance between the plate yokes 12a and 12b can be easily adjusted by tightening or loosening the magnetic field adjusting bolts 28a, 28b, thereby easily adjusting the strength and the distribution of the magnetic field.

Especially, provision of not only the magnetic field adjusting bolt 28b but the magnetic field adjusting bolt 28a which has a sufficient distance from the fulcrum A makes possible to easily adjust the distance between the plate yokes 12a and 12b, making possible to easily and precisely adjust the strength of the magnetic field, leading to improved work efficiency.

Figure 4:
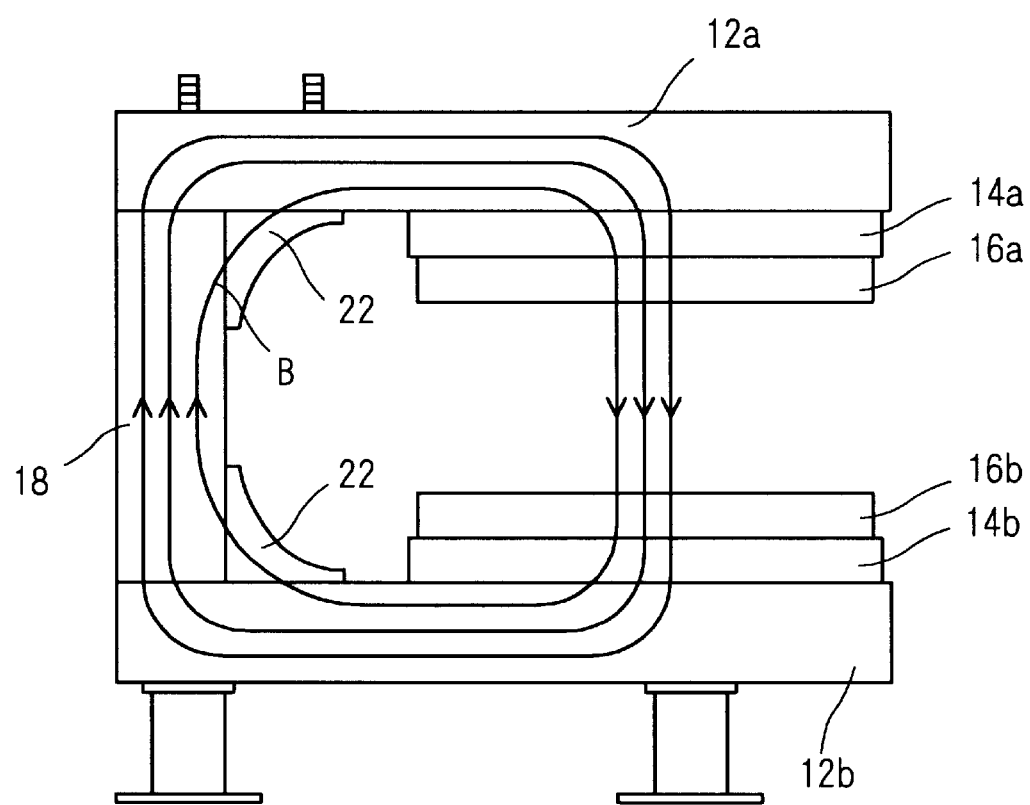
FIG. 4 is an illustration showing a magnetic field generated in the embodiment in FIG. 1.

Further, the enhancing members 22 are made of magnetic material. Thus, the enhancing members 22 function as part of the yoke, making the yoke practically thicker. Specifically, in the inside surfaces of the connection between the column yoke 18 and respective plate yokes 12a, 12b, there will be leakage magnetic flux resulting from magnetic saturation in the yokes if there is no enhancing members 22. However, as shown in FIG. 4, the provision of the enhancing members 22 makes the magnetic flux B run through the enhancing members 22 which are part of the yokes, reducing the leakage magnetic flux and thereby providing a stronger magnetic field. As a specific example, magnetic field intensity was measured at the center of the space with and without the enhancing members 22, with other conditions being equal. The measured magnetic field intensity was 0.2 T (tesla) without the enhancing members 22. With the enhancing members 22, the magnetic field intensity was enhanced to 0.2004 T (tesla).

Further, by providing the enhancing members 22 at the farthest locations from respective permanent magnets 14a, 14b thereby increasing the distance between each enhancing member 22 and respective permanent magnets 14a, 14b, the magnetic flux generated by the permanent magnets 14a, 14b is prevented from short-circuiting to the enhancing members 22. Thus, it becomes possible to prevent magnetic flux short circuiting, thereby maintaining a uniform magnetic field as well as enhancing the magnetic field.

Further, by using the enhancing members 22 having a curved slant face 26, it becomes possible to provide a larger space for accommodating the patient in the assembled MRI apparatus.

Figure 5:
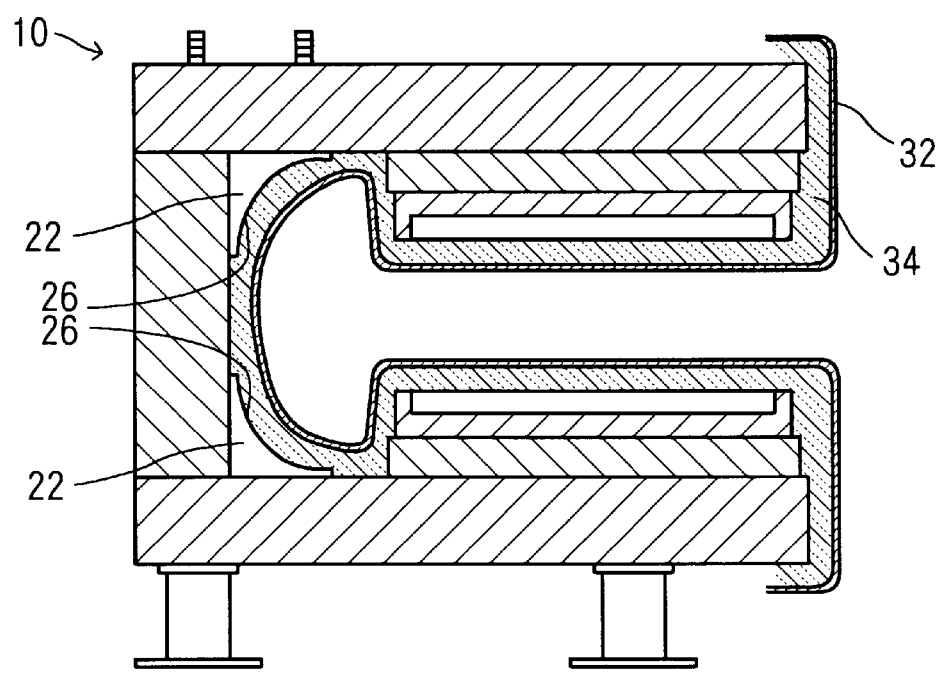
FIG. 5 is an illustration showing a space for accommodating a patient if enhancing members each having a curved slant face are used.
Figure 6:
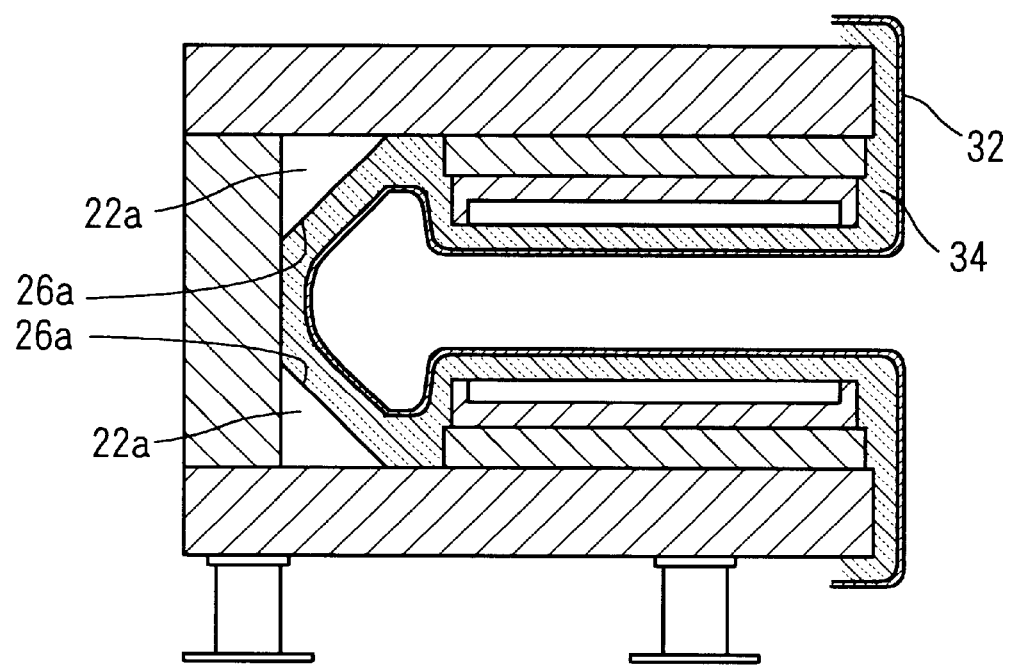
FIG. 6 is an illustration showing a space for accommodating a patient if enhancing members each having a slant face which is not curved are used.

As shown in FIG. 5, when the generator 10 is assembled into the MRI apparatus, the generator 10 is covered by a decorative cover 32. Heat insulating material 34 for maintaining the magnetic circuit at a constant temperature is inserted between the generator 10 and the decorative cover 32. The insertion of the heat insulating material 34 is to protect diagnostic images from adverse effect caused by change in magnetic field due to temperature change in the magnetic circuit. With the addition of these materials, it becomes clearer to see that the use of the enhancing members 22 having the curved slant face 26 can provide a larger space for accommodating the patient. The MRI apparatus allows a medical doctor to perform medical operation while watching the obtained image. The greater space increases operability by increased ease of handling medical appliances for example. This advantage is clearly understood from comparison of FIG. 5 with FIG. 6 (showing the space for accommodating the patient if enhancing members 22a each having a slanted face 26a which is not curved are used.)

In addition, the leakage magnetic flux can further be decreased by curving a portion of the enhancing members 22 where most leakage magnetic flux is expected.

Further, the enhancing members 22 may be made of nonmagnetic material such as stainless steel. If the enhancing members 22 are made of nonmagnetic material, the advantage of intensified magnetic field described above will not be obtained. On the other hand, the possibility of the magnetic flux short circuiting is eliminated, and therefore there is no limitation on the location or the shape of the enhancing members 22 as long as the enhancing members 22 are provided at portions where the column yoke 18 is connected to the plate yokes 12a, 12b.

Figure 7:
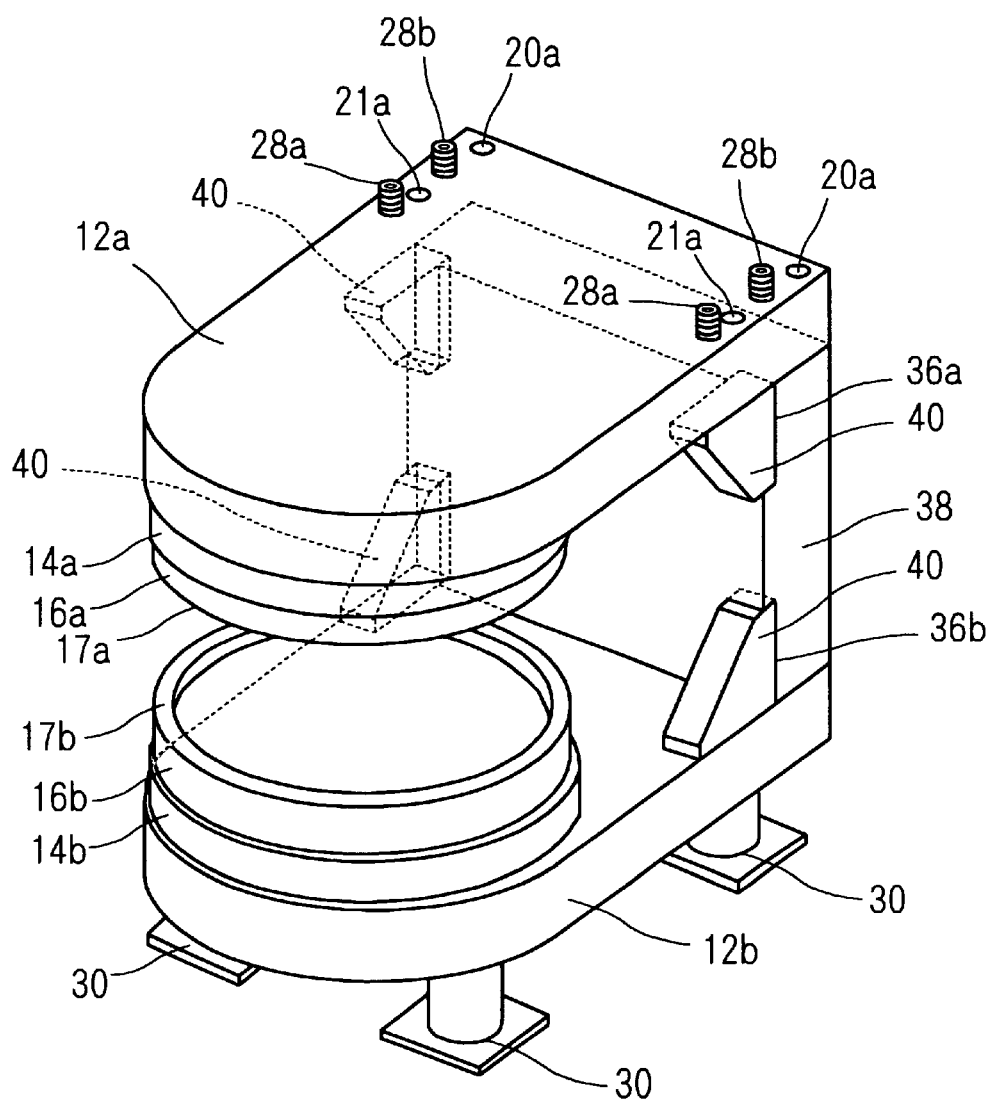
FIG. 7 is a perspective view of another embodiment of the present invention.
Figure 8:
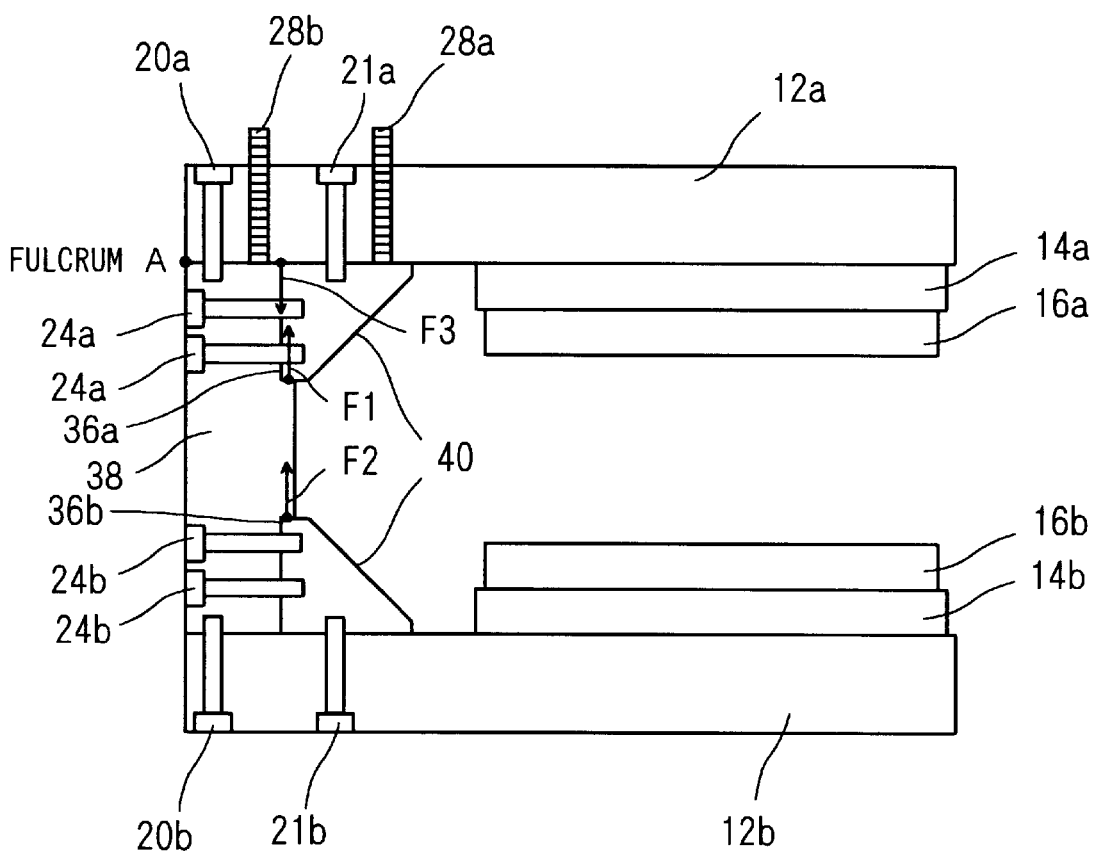
FIG. 8 is an illustration showing a primary portion of the embodiment in FIG. 7.

FIGS. 7 through 9 show a magnetic field generator for MRI 10a as another embodiment of the present invention.

Figure 10:
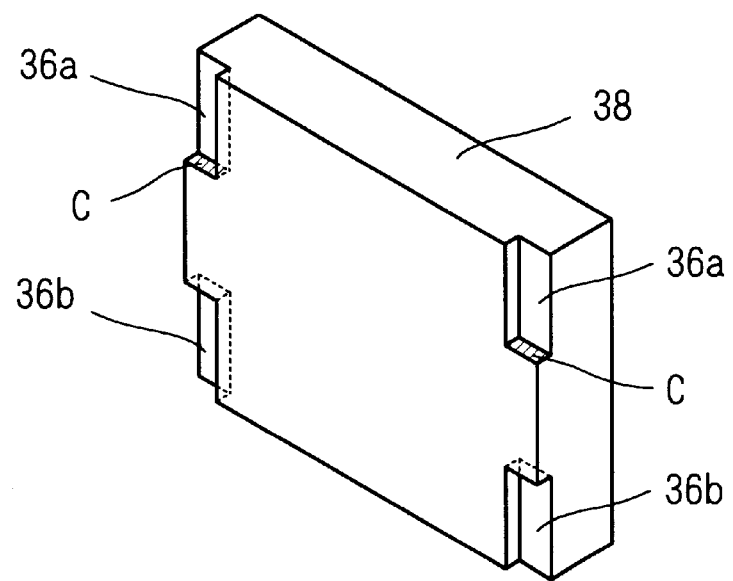
FIG. 10 is a perspective view showing a column yoke used in the embodiment in FIG. 7.

The generator 10a uses a column yoke 38 formed with 10 engaging portions 36a, 36b, and enhancing members 40 each having a straight slope face. As shown in FIG. 10, each of the in engaging portions 36a, 36b includes a recess. The engaging portions 36a are respectively formed at upper corners of the column yoke 38, where the enhancing members 40 are attached. The engaging portions 36b are respectively formed at lower corners of the column yoke 38, where the enhancing members 40 are attached. When assembling, the enhancing members 40 are respectively attached to the engaging portions 36a, 36b of the column yoke 38, and then the column yoke 38 and plate yokes 12a, 12b are assembled. The enhancing members 40 may be welded to the engaging portions 36a, 36b. All the other aspects of the generator 10a are the same as those of the generator 10, and so the description will not be repeated here.

In general, a magnetic field generator for MRI of this type is structured into a general Roman character of C when viewed from a side. Because of this very unstable supporting structure, while being transported, weight and pulling force from the upper plate yoke, upper permanent magnet and pole piece tend to lower the upper plate yoke, upper permanent magnet and pole piece, exerting strong stress to the fixing bolts (the fixing bolts 24a, 24b in FIG. 8, especially the fixing bolts 24a).

To improve the situation, as according to the generator 10a, the column yoke 38 is formed with engaging portions 36a, 36b, and these engaging portions 36a, 36b are respectively engaged by enhancing members 40.

Then, as shown in FIG. 8, force F1 is exerted from the engaging portions 36a to respective lower end faces of the enhancing members 40. Support to the enhancing members 40 provided by the engaging portions 36a reduces the stress to the fixing bolts 24a while increasing power for supporting the plate yoke 12a, providing better protection to the plate yoke 12a from being out of adjustment. Further, by engaging the enhancing members 40 with respective engaging portions 36b, force F2 is exerted from upper end faces of the enhancing members 40 to the column yoke 38, supporting the column yoke 38, reducing the stress to the fixing bolts 24b while increasing power for supporting the column yoke 38.

As a result, according to the generator 10a, alignment between the pair of plate yokes 12a, 12b can be more stabilized without much increase in cost, making possible to shorten time required for re-adjusting the magnetic field distribution after the transportation.

It should be noted that according to the generator 10a, significant advantage is achieved by engaging the enhancing members 40 with the engaging portions 36a. Specifically, if the enhancing members 40 are supported by the engaging portions 36a, the strength against force F3 is improved by about 40 times as compared with the case where there is no support from the engaging portions 36a. Further, each of the enhancing members 40 has rupture strength of 2.1 ton/cm. Thus, the enhancing member 40 can be supported without being ruptured if each engaging portion 36a provides an area of about 10 cm$^2$ for supporting the enhancing member 40, which is a shaded portion C in FIG. 10.

Figure 11:
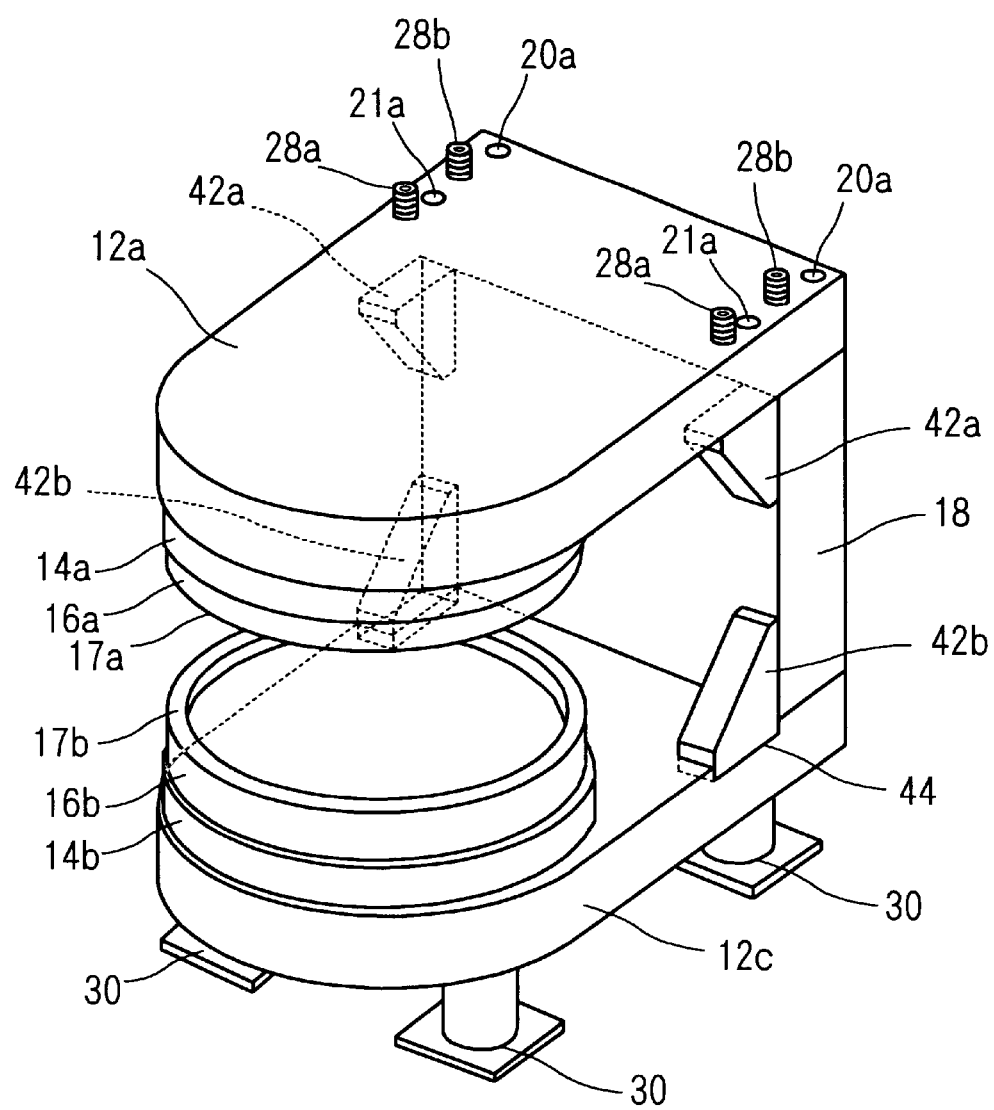
FIG. 11 is a perspective view of another embodiment of the present invention.
Figure 12:
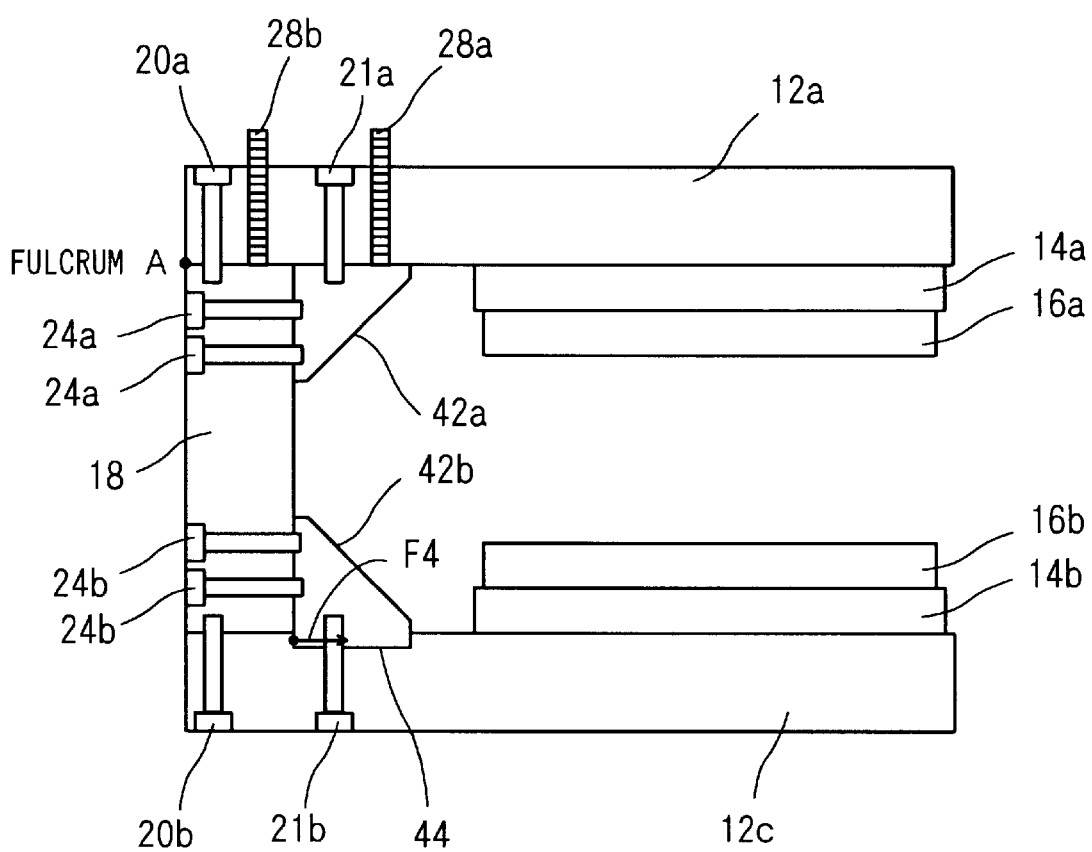
FIG. 12 is an illustration showing a primary portion of the embodiment of FIG. 11.

FIGS. 11 and 12 show another magnetic field generator for MRI 10b as another embodiment of the present invention.

The generator 10b uses enhancing members 42a, 42b each having a straight slant face. Further, as a lower plate yoke, a plate yoke 12c having engaging portions 44 is used. Each of the engaging portions 44 includes a recess, and is formed at a specific location of the plate yoke 12c, where the enhancing member 42b is attached. When assembled, the enhancing members 42b may be welded to the engaging portions 44 respectively. All the other aspects of the generator 10b are the same as those of the generator 10, and so the description will not be repeated here.

As has been described earlier, a magnetic field generator for MRI of this type has a very unstable supporting structure. Thus, while being transported, weight and pulling force from the upper plate yoke, upper permanent magnet and pole piece tend to tilt the column yoke. (Referring to FIG. 12, the column yoke 18 tends to tilt rightward.) Thus, the fixing bolts (especially the fixing bolts 21b in FIG. 12) receive strong stress.

To improve the situation, as according to the generator 10b, the lower plate yoke 12c is formed with engaging portions 44, and these engaging portions 44 are respectively engaged by enhancing members 42b. Then, the force acting on the column yoke 18 to tilt rightward is counteracted by force F4 exerted from the plate yoke 12c to respective enhancing members 42b. The enhancing members 42b are footed by respective engaging portions 44, reducing the stress to the fixing bolts 21b while increasing power for supporting the column yoke 18.

As a result, according to the generator 10b, the column yoke 18 can be supported more stably without much increase in cost, making possible to provide better protection to the column yoke 18 from being out of alignment.

Needless to say, the generators 10a and 10b provide the same advantages as provided by the generator 10 except for those achieved by the use of the enhancing members having a curved slant face.

Figure 13:
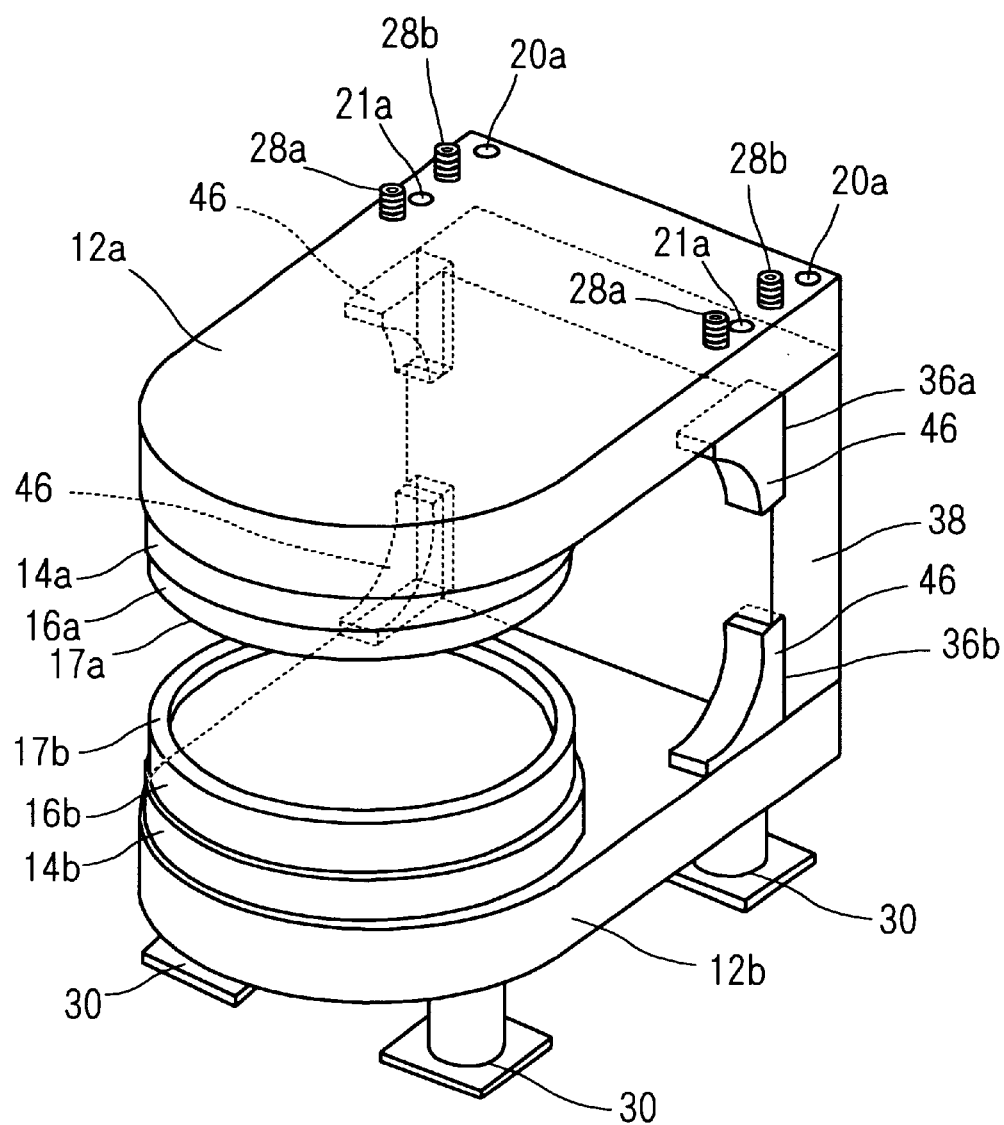
FIG. 13 is a perspective view of still another embodiment of the present invention.
Figure 14:
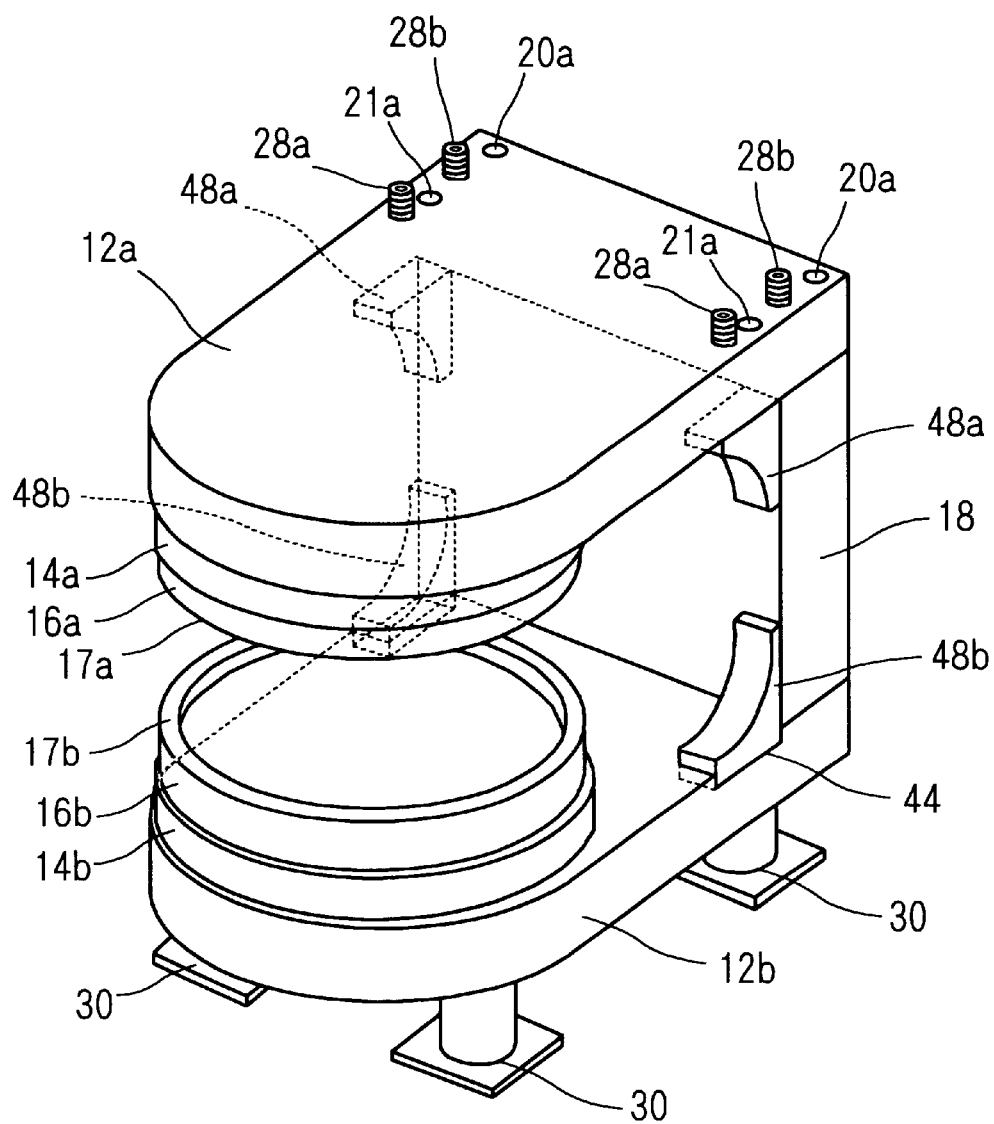
FIG. 14 is a perspective view of another embodiment of the present invention.

It should be noted here that the enhancing members 40 of the generator 10a shown in FIG. 7 may be replaced by the enhancing members 46 each having a curved slant face as used in a generator 10c shown in FIG. 13. Likewise, the enhancing members 42a, 42b of the generator 10b shown in FIG. 11 may be replaced by the enhancing members 48a, 48b each having a curved slant face as used in a generator 10d shown in FIG. 14.

According to the generators 10c and 10d, advantages provided respectively the generators 10a and 10b as well as the above-described advantages provided by the curved enhancing members are obtained.

According to the generators 10a through 10d, only one of the side face and the bottom face of each enhancing member is fitted into the engaging portion. However, both of the side and bottom faces may be fitted into respective engaging portions.

Figure 15A:
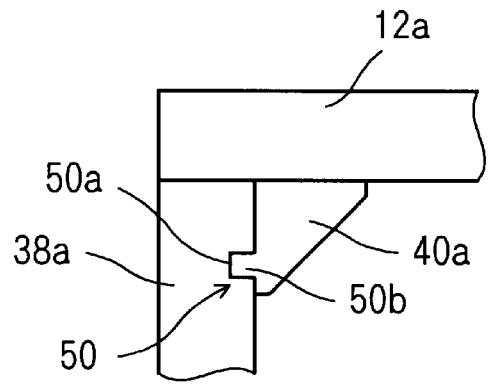
FIG. 15 is an illustration showing variations in the engaging portion of the column yoke with the enhancing member.

Further, the engagement of the enhancing member may not require the whole surface of the side face or the bottom face of the enhancing member. Specifically, as shown in FIG. 15(a), an engaging portion 50 may be formed partially. This engaging portion 50 includes a recess 50a formed in the column yoke 38a and a projection 50b formed in the enhancing member 40a, having a circular or rectangular cross section for example.

Figure 15B:
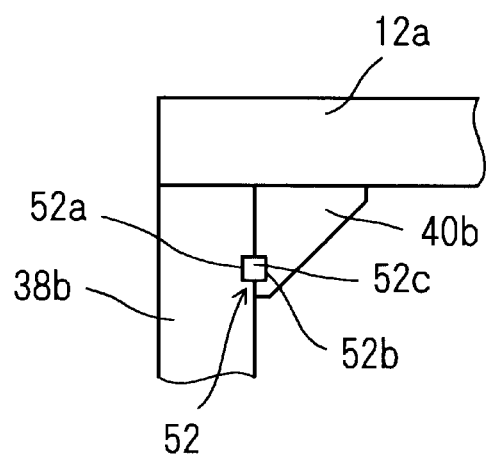

Further, an engaging portion 52 as shown in FIG. 15(b) may be provided. The engaging portion 52 comprises a recess 52a formed in the column yoke 38b, a recess 52b formed in the enhancing member 40b, and a cylindrical or prismatic wedge 52c. The wedge 52c is driven into a hollow space formed by the recesses 52a and 52b.

It should be noted that preferably each of the engaging portion 50 and the wedge 52c should have a cross section greater than the cross section of the fixing bolt 24a.

Figure 15C:
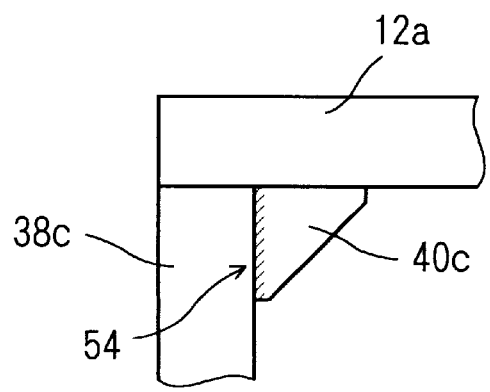

Further, according to the engaging portion 54 shown in FIG. 15(c), the column yoke 38c and the enhancing member 40c are welded together.

The engaging portions 50 through 54 shown in FIGS. 15(a) through 15(c) are also applicable to the contacting portions of the enhancing member provided in the lower plate yoke, to the column yoke or to the lower plate yoke.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A magnetic field generator for MRI comprising:
   a pair of plate yokes opposed to each other with space in between,
   a magnet provided in each of the opposed surfaces of the pair of plate yokes,
   a column yoke connected to the pair of plate yokes for magnetic connection of the pair of plate yokes,
   an enhancing member provided on inner surfaces in a connecting portion of the column yoke and the plate yoke, and
   a fixing bolt attached to the enhancing member and to at least one of the column yoke and the plate yoke.

2. A magnetic field generator for MRI comprising;
   a pair of plate yokes opposed to each other with space in between,
   a magnet provided in each of the opposed surfaces of the pair of plate yokes,
   a column yoke connected to the pair of plate yokes for magnetic connection of the pair of plate yokes,
   an enhancing member provided on inner surfaces in a connecting portion of the column yoke and the plate yoke, and
   an engaging portion attached to at least one of the plate yoke and the column yoke, and to the enhancing member.

3. A magnetic field generator for MRI comprising:
   a pair of plate yokes opposed to each other with space in between,
   a magnet provided in each of the opposed surfaces of the pair of plate yokes,
   a column yoke connected to the pair of plate yokes for magnetic connection of the pair of plate yokes,
   an enhancing member provided at each end of a connecting portion between the column yoke and the plate yoke, in inner surfaces of the column yoke and the plate yoke, and
   a first magnetic field adjusting bolt screwed into the plate yoke, with a tip of the first bolt contacting corresponding one of the enhancing members.

4. The generator according to claim 3, further comprising a second magnetic field adjusting bolt screwed into the plate yoke, with a tip of the second bolt contacting an upper end face of the column yoke.

5. A magnetic field generator for MRI comprising;
   a pair of plate yokes opposed to each other with space in between,
   a magnet provided in each of the opposed surfaces of the pair of plate yokes,
   a column yoke having two end faces each connected to corresponding one of the plate yokes for magnetic connection of the pair of plate yokes,
   a fixing bolt screwed through the plate yoke into the end face, and attached to the plate yoke and the column yoke, and
   an enhancing member provided on inner surfaces in a connecting portion of the column yoke and the plate yoke.

6. The generator according to one of claims 1 through 5, wherein the enhancing member is made of magnetic material.

7. The generator according to one of claims 1 through 5, wherein the enhancing member has a curved slant face.

* * * * *